United States Patent [19]

Mandeville

[11] 4,192,008
[45] Mar. 4, 1980

[54] WAVE DIGITAL FILTER WITH MULTIPLEXED ARITHMETIC HARDWARE

[75] Inventor: Gordon J. Mandeville, Lawrence, Mass.

[73] Assignee: Bell Telephone Laboratories, Incorporated, Murray Hill, N.J.

[21] Appl. No.: 935,873

[22] Filed: Aug. 23, 1978

[51] Int. Cl.² .......................... G06F 15/34; H03H 7/10
[52] U.S. Cl. ..................................................... 364/724
[58] Field of Search ..................... 364/724; 333/70 R

[56] References Cited

U.S. PATENT DOCUMENTS

| | | | |
|---|---|---|---|
| 3,919,671 | 11/1975 | Fettweis et al. | 333/70 R |
| 3,967,099 | 6/1976 | Fettweis | 364/724 |
| 3,980,872 | 9/1976 | Fettweis et al. | 364/724 |
| 4,095,276 | 6/1978 | Verkroost et al. | 364/724 |

OTHER PUBLICATIONS

Fettweis et al., "On Adaptors for Wave Digital Filters," *IEEE Trans. on Acoustics, Speech & Signal Processing*, vol. ASSP-23, No. 6, Dec. 1975, pp. 516–525.

Nouta, "Class of Wave Digital Filters Consisting Only of Address & Multipliers" *Electronics Letters*, vol. 12, No. 19, Sep. 1976, pp. 500–501.

*Primary Examiner*—David H. Malzahn
*Attorney, Agent, or Firm*—Stephen M. Gurey

[57] ABSTRACT

The wave digital filter derived from a symmetric lattice reference filter includes two one-port networks each of which consists of storage elements interconnected by arithmetic units. Each arithmetic unit comprises a digital multiplier and three digital adders. Higher order filters thus require a substantial amount of arithmetic hardware. In accordance with the present invention, the amount of arithmetic hardware in the wave digital filter derived from a symmetric lattice filter is substantially reduced by multiplexing an arithmetic unit in each one-port network. In particular, a single arithmetic unit in each one-port is successively configured as each individual arithmetic unit of the non-multiplexed one-port. Intermediate output signals are stored in temporarily vacant storage elements. In one described embodiment of the present invention, the two multiplexed one-port networks of the wave digital filter are further multiplexed to require only one arithmetic unit.

9 Claims, 16 Drawing Figures

TIME SLOT 1 (AU₁)

TIME SLOT 2 (AU₂)

TIME SLOT 3 (AU₃)

TIME SLOT 4 (AU₄)

| STORAGE | TIME SLOTS | | | | |
| ELEMENTS | 1 | 2 | 3 | 4 | 1 |
| 805 | $b_2 AU_1$ | $b_1 AU_2$ | ⟶ | ⟶ | $b_2 AU_1$ |
| 806 | ⟶ | $b_2 AU_2$ | $b_1 AU_3$ | ⟶ | ⟶ |
| 807 | ⟶ | ⟶ | $b_2 AU_3$ | $b_1 AU_4$ | ⟶ |
| 808 | ⟶ | ⟶ | ⟶ | $b_2 AU_4$ | ⟶ |

WAVE DIGITAL FILTER WITH MULTIPLEXED ARITHMETIC HARDWARE

BACKGROUND OF THE INVENTION

This invention relates to digital filters and, more particularly, to wave digital filters.

The wave digital filter, which is a large family of digital filter structures, has recently been the subject of increased practical investigation due to its many useful properties, such as low coefficient sensitivity which allows for a significant hardware savings.

In addition, the digital wave filter structure can be realized completely free of both large scale oscillations (overflow oscillations) and granularity oscillations (limit cycles) thereby eliminating the need to protect against overflows and saving hardware.

The wave digital filter is derived from a so-called reference filter, such as a classical ladder or lattice structure. The ladder structure has received a great deal of attention in the literature such as in the following articles: "Design of Wave Digital Filters for Communications Applications," by A. Fettweis, G. J. Mandeville and C-Y Kao, Proc. of IEEE International Symposium on Circuits and Systems, pp. 162–165, April, 1975; "Suppression of Parasitic Oscillations in Wave Digital Filters", by A. Fettweis and K. Meerkotter, IEEE Trans. Circuits and Systems, Vol. CAS-22, No. 3, pp. 239–246, March 1975; and "Suppression of Parasitic Oscillations in Half-Synchronic Wave Digital Filters", by A. Fettweis and K. Meerkotter, IEEE Trans. Circuits and Systems, Vol. CAS-23, No. 2, pp. 126–126, February, 1976. The wave digital filter derived from LC ladders, however, has some hardware disadvantages. Such filters are typically realized as cascaded parallel and series 3-port adapters wherein 3-port adapters are special purpose arithmetic units comprised of one or two binary multipliers and four binary adders. Although adapters of the same type have identical signal flow graphs, their location in the filter influences their hardware structure. Thus, each adapter must be uniquely realized so as to compensate for the buildup of computational delays in the ladder structure. Although it is possible to realize ladder filters without computational delay buildup by deriving them from a reference filter of cascaded unit elements (see, for example, "Digital Filter Structures Related to Classical Filter Networks", by A. Fettweis, Arch. Elektr. Ubertrag. 25, 1971, pp. 79–89), such a structure only allows for transmission zeros at zero and one-half the sampling frequency which limits the application of the structure. Another disadvantage of ladder structures is that the number of delays (or storage elements) is greater than the degree of the transfer function of the filter, i.e., the ladder structures are not canonic in delays. In "Canonic Realization of Ladder Wave Digital Filters", by A. Fettweis, Int. Journal of Circuit Theory and App., Vol. 3, December 1975, pp. 321–332, a modification is suggested such that ladders can be made canonic in delays. This modified approach, however, requires additional adders.

The wave digital filter derived from a symmetric lattice is canonic in delays with no additional hardware required. Furthermore, this structure can be realized without computational delay buildup. Thus, it can be realized as cascaded unit elements without restrictions on the transmission zeros. This results in all adapters (arithmetic units) being identical in structure. Such an arithmetic unit can be integrated and together with storage elements used as building block for digital filters. The lattice wave digital filter is discussed in "Wave Digital Lattice Filters" by A. Fettweis, H. Levin and A. Sedlmeyer, Int. Journal on Circuit Theory and App., Vol. 2, June 1974, pp. 203–211.

An object of this invention is to realize a lattice wave digital filter having a minimum number of arithmetic units and, in particular, to minimize the number of arithmetic multipliers required in the filter realization.

SUMMARY OF THE INVENTION

In a wave digital filter derived from a symmetric lattice, the number of arithmetic units which form predetermined arithmetic combinations from applied input signals are minimized in accordance with the present invention. In one embodiment, the two one-port digital networks of the wave digital filter are multiplexed separately. By adjusting the multiplicand of the multiplier of an arithmetic unit at predetermined instants, a single arithmetic unit is successively configured as each arithmetic unit of the one-port network. At each predetermined instant, the outputs of the arithmetic unit are selectively inputted to a plurality of storage elements and signals previously stored in the storage elements are selectively inputted to the inputs of the multiplexed arithmetic unit. At any instant, therefore, previously calculated arithmetic unit outputs are available as inputs for further calculation.

In another embodiment, both one-port digital networks of the filter are multiplexed together to require only one arithmetic unit for the filter. In the embodiment, the arithmetic unit is alternatively configured as an arithmetic unit from each of the one-port networks.

It is a feature of the present invention that the multiplexed filter network requires no additional storage elements for storing intermediate arithmetic unit outputs.

DETAILED DESCRIPTION

Figure 1:
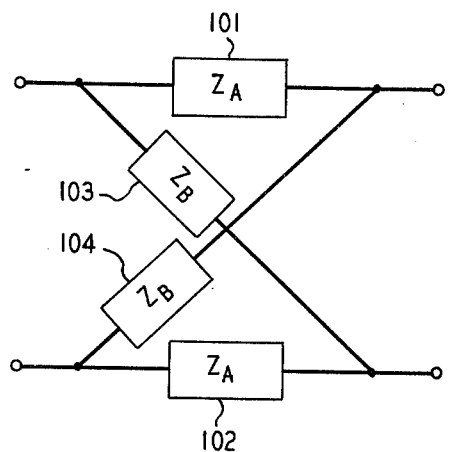
FIG. 1 is a symmetric lattice reference filter.

The reference symmetric lattice filter is shown in FIG. 1. Impedances 101 and 102 are both equal to $Z_A$. Impedances 103 and 104 are both equal to $Z_B$. $Z_A$ and $Z_B$ are loss-less driving point impedances or, in other words, pure reactances. The reflection coefficient $S_A$ of impedance $Z_A$ is given by:

$$S_A = (Z_A - 1/Z_A + 1) \quad (1)$$

and the reflection coefficient $S_B$ of impedance $Z_B$ is given by:

$$S_B = Z_B - 1/Z_B + 1. \quad (2)$$

Figure 2:
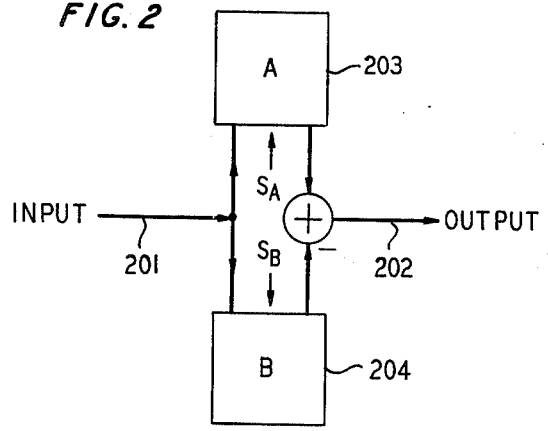
FIG. 2 is the wave digital equivalent of the reference filter of FIG. 1.

It has been shown in the aforenoted article entitled "Wave Digital Lattice Filters" that the wave digital filter structure of the symmetric lattice reference filter of FIG. 1 is the structure of FIG. 2. With reference to FIG. 2, one-port network 203 is the wave digital realization of the impedance $Z_A$ and one-port network $Z_B$ is the wave digital realization of impedance $Z_B$. A digital signal on lead 201, representing samples of an analog signal to be filtered is inputted to one-port networks 203 and 204 and the digital difference between the outputs from networks 203 and 204, respectively, is the filtered digital output signal which can be reconverted into an analog signal or which can remain in digital format for further processing.

Figure 3A:
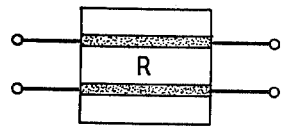
FIG. 3A is a unit element used to configure the reference filter and FIG. 3B is the wave digital representation of the unit element.
Figure 3B:
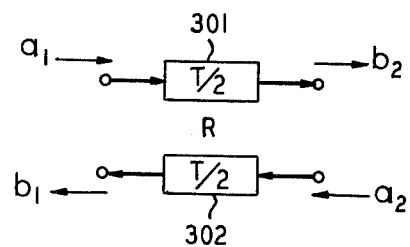

Since the impedances $Z_A$ and $Z_B$ are purely reactive, networks 101 and 102 can be realized as LC networks or as open or short-circuited cascaded unit elements. For purposes of the present invention $Z_A$ and $Z_B$ are considered to be realized using cascaded unit elements, where the unit element is a structure well known in the filter art and is represented in FIG. 3A as having inherent impedance R. The wave digital implementation of the unit element is shown in FIG. 3B. Networks 301 and 302 are delay elements in which the delay T/2 of each element is one-half the reciprocal of the sampling frequency. The wave digital implementations 203 and 204 of impedances $Z_A$ and $Z_B$, respectively, are each represented by cascaded wave digital unit elements of the type in FIG. 3B. Since, however, each unit element has a different characteristic impedance R, the cascaded unit elements are interconnected with adapters, to account for the interaction between unit elements.

Figure 4:
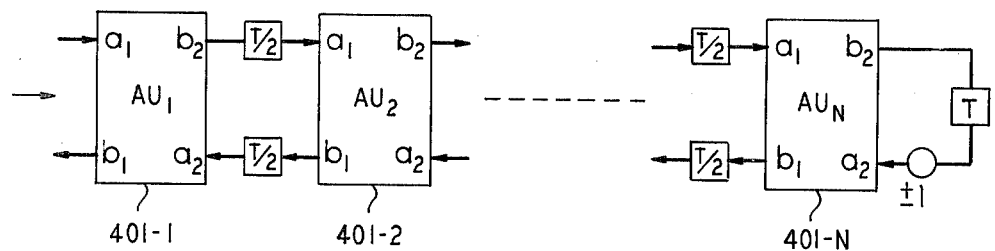
FIG. 4 shows the wave digital representation of an $N^{th}$ order one-port network used in the digital filter of FIG. 2.
Figure 5:
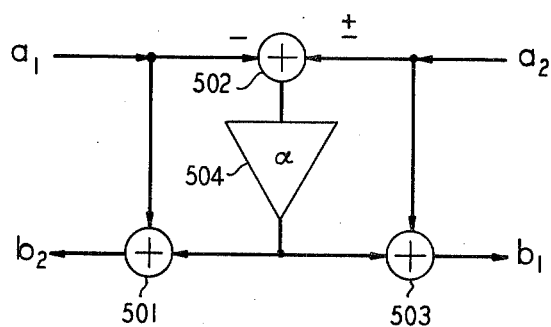
FIG. 5 shows the circuitry of each arithmetic unit within the one-port network of FIG. 4.

A wave digital implementation of an $N^{th}$ order one-port (i.e., networks 203 or 204 in FIG. 2) as cascaded unit elements is shown in FIG. 4. As can be noted, adapters 401−1 through 401−N are interconnected between the wave digital implementations of the cascaded unit elements. Each adapter, also known as an arithmetic unit (AU), has a structure of the form shown in FIG. 5. With reference to FIG. 5, the arithmetic unit includes three digital adders 501, 502 and 503 and a digital multiplier 504, the latter having a multiplier coefficient $\alpha$. Each arithmetic unit in FIG. 4 is therefore structurally identical except for a value of the multiplier coefficient $\alpha$. Arithmetic units 401−1 through 401−N are also identified with the notations $AU_1$ through $AU_N$ to functionally distinguish each of the N configurations.

Figure 6:
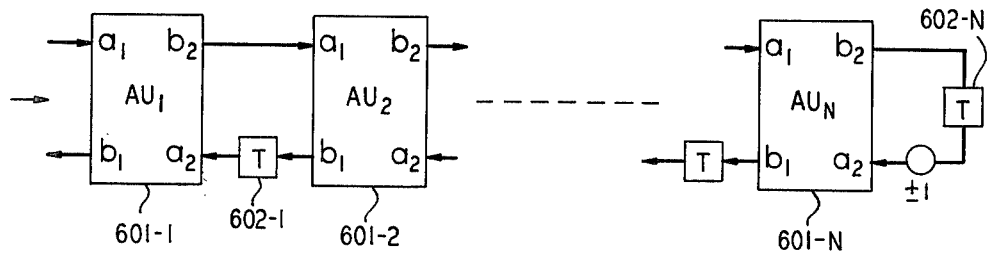
FIG. 6 is a modification of the $N^{th}$ order one-port network shown in FIG. 4.

An equivalent realization of the one-port network of FIG. 4 is shown in FIG. 6. As can be noted in FIG. 6, the number of delay elements has been reduced with a commensurate increase in the delay time of the remaining elements. It is the structure of FIG. 6 that is used to implement the one-port networks 203 and 204 in FIG. 2.

Figure 7:
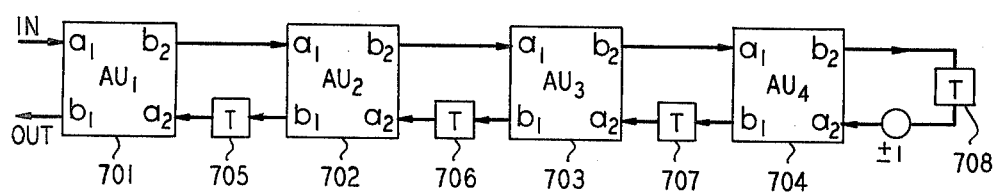
FIG. 7 is a $4^{th}$ order one-port network.

In accordance with the present invention, the arithmetic hardware necessary to implement each digital one-port is reduced by multiplexing one arithmetic unit for multiple purpose functioning. Thus, the multiplexed arithmetic unit is sequentially modified to function as $AU_1$, $AU_2$ . . . $AU_N$ by a corresponding change of the multiplier coefficient $\alpha$. With reference to FIG. 6, it can be noted that storage elements 602−1 through 602−N are connected to the $a_2$ inputs of arithmetic units 601−1 through 601−N, respectively. When a single arithmetic unit is multiplexed to sequentially function as $AU_1$, $AU_2$ . . . $AU_N$, a temporary storage element would appear to be required to store the $b_2$ output of each configured arithmetic unit for use as an $a_1$ input to the next sequentially configured arithmetic unit. As will be described in detail hereinafter, such a temporary storage element is not required so that the one-port can be multiplexed without additional storage elements:

A fourth order multiplexed one-port network is described in detail hereinbelow. FIG. 7 shows a prior art fourth order one-port network having four arithmetic units 701, 702, 703 and 704 and four storage elements 705, 706, 707 and 708. Storage elements 705-708 each have an input-to-output delay of T, where T is the reciprocal of the sampling frequency and can be, for example, shift registers. Thus, data is shifted in and out of each storage element at each sampling instant. In accordance with the present invention, one arithmetic unit is multiplexed to sequentially perform the functions of arithmetic units 701, 702, 703 and 704. As will be shown, four storage elements are sufficient to implement the multiplexed structure and thus no additional temporary storage locations are necessary.

In order to realize the structure of FIG. 7 with only one arithmetic unit, the sampling interval T is divided into four equal time slots. During the first time slot the multiplexed arithmetic unit performs the functions of unit 701 ($AU_1$). During the second time slot the multiplexed arithmetic unit performs the functions of unit 702 ($AU_2$). During the third interval the multiplexed arithmetic unit performs the functions of unit 703 ($AU_3$) and during the fourth time slot the multiplexed arithmetic unit performs the functions of unit 704 ($AU_4$).

Figure 8A:
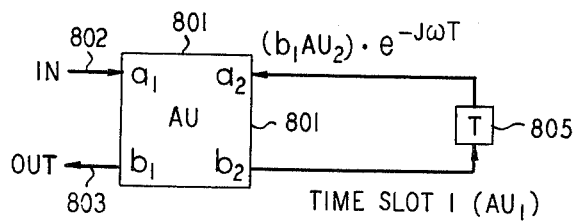
FIGS. 8A-8D functionally illustrate a multiplexed $4^{th}$ order one-port network in accordance with the principles of the present invention.

FIGS. 8A, 8B, 8C and 8D functionally illustrate the operation of the multiplexed one-port network of FIG. 7. FIG. 8A illustrates the operation of the one-port network during time slot 1 in the subdivided sampling interval. During this first time slot the multiplier coefficient $\alpha$ of an adjustable arithmetic unit 801 is set to the coefficient of the multiplier in unit 701 to function as $AU_1$. The $a_1$ input of arithmetic unit 801 is the digital input sample on lead 802. With reference to FIG. 7, it can be seen that the $a_2$ input of $AU_1$ should be the $b_1$ output of arithmetic unit 702 ($AU_2$) from the previous sampling instant (i.e., delayed by T seconds). The notation used hereinbelow to designate the $b_i$ output of the $k^{th}$ arithmetic unit is $b_iAU_k$. An output $b_i$ of the $k^{th}$ arithmetic unit from a previous sampling instant is designated as $(b_iAU_k)e^{-j\omega T}$. Therefore, with reference again to FIG. 8A, the $a_2$ input of arithmetic input 801 is $(b_1AU_2)e^{-j\omega T}$, which was generated as the $b_1$ output of arithmetic unit $AU_2$ in the previous sampling instant and stored in storage element 805. With these $a_1$ and $a_2$ inputs, the $b_1$ output generated on lead 803 is the filtered digital output signal. The $b_2$ output of arithmetic unit 801 must be used during time slot 2 as the $a_1$ input to arithmetic unit $AU_2$ and, thus, must be stored. Since storage element 805 is emptied of its stored digital signal $(b_1AU_2)e^{-j\omega T}$ at the beginning of time slot 1, the $b_2$ output of $AU_1$ can be temporarily stored in this storage location.

Figure 8B:
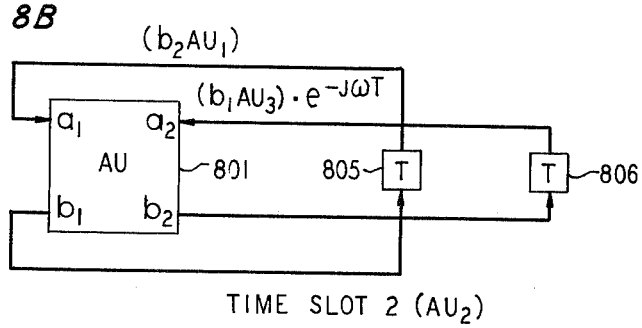
Figure 8C:
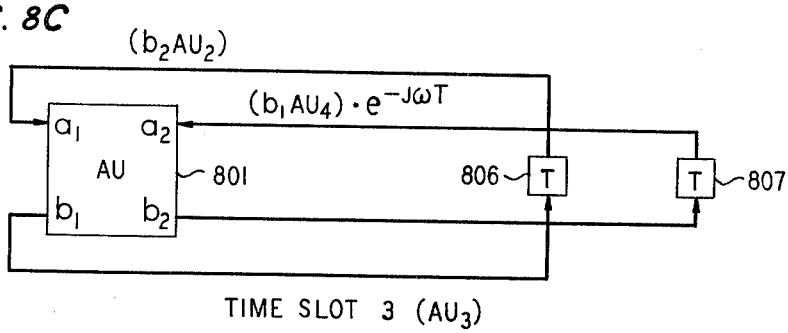

During time slot 2, arithmetic unit 801 is configured as arithmetic unit $AU_2$ (i.e., the coefficient of the multiplier within unit 801 is set to the coefficient of the multiplier required in arithmetic unit $AU_2$). As can be noted in FIG. 7, the $a_1$ input of $AU_2$ is the $b_2$ output of $AU_1$ and the $a_2$ input is the $b_1$ output of $AU_3$ from the previous sampling instant. With reference to FIG. 8B, it can be noted that $b_2AU_1$ is outputted from storaged element 805 to the $a_1$ output which was stored during time slot 1. Storage element 806 outputs $(b_1AU_3)e^{-j\omega T}$ to the $a_2$ input of arithmetic unit 801, the latter having been stored in element 806 during the previous sampling interval. The $b_1$ output of arithmetic unit 801 is stored in storage element 805 to replace the temporarily stored $b_2AU_1$ signal. This $b_1AU_2$ signal remains in storage element 805 until time slot 1 in the next sampling instant. The $b_2$ output of arithmetic unit 801 is temporarily stored in storage location 706 since its previously stored signal is no longer needed.

During time slot 3 the coefficient of the multiplier is adjusted to configure arithmetic unit 801 as $AU_3$. The $a_1$ input of $AU_3$ is $b_2AU_2$, which was stored in storage location 806 during time slot 2. The $a_2$ input to arithmetic unit 801 is $(b_1AU_4)e^{-j\omega T}$ from storage location 807, the latter having been stored during the previous sampling interval. The $b_1$ output of arithmetic unit 801 is stored in storage location 806 to be used during the next sampling interval and the $b_2$ output of arithmetic unit 801 is temporarily stored in storage location 807 to be used during time slot 4 in the present sampling interval.

Figure 8D:
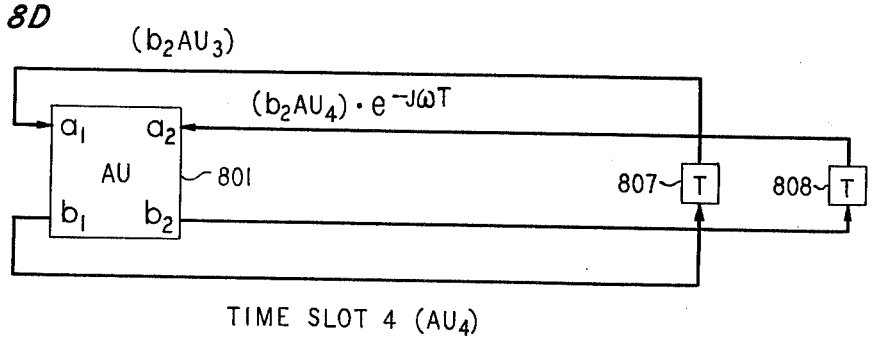

FIG. 8D illustrates the configuration of the one-port network during time slot 4 wherein arithmetic unit 801 is configured as $AU_4$. During this time slot $b_2AU_3$, having been stored in storage location 807 in time slot 3, is outputted to the $a_1$ input of arithmetic unit 801. At the same instant, $(b_2AU_4)e^{-j\omega T}$ is inputted to the $a_2$ input of arithmetic unit 801 from storage location 808, the signal having been stored there during the previous sampling interval. The $b_1$ output of arithmetic unit 801 is stored in storage location 707 and the $b_2$ output of arithmetic unit 801 is stored in storage location 708 for use during the next sampling interval.

Figures 9, 10:
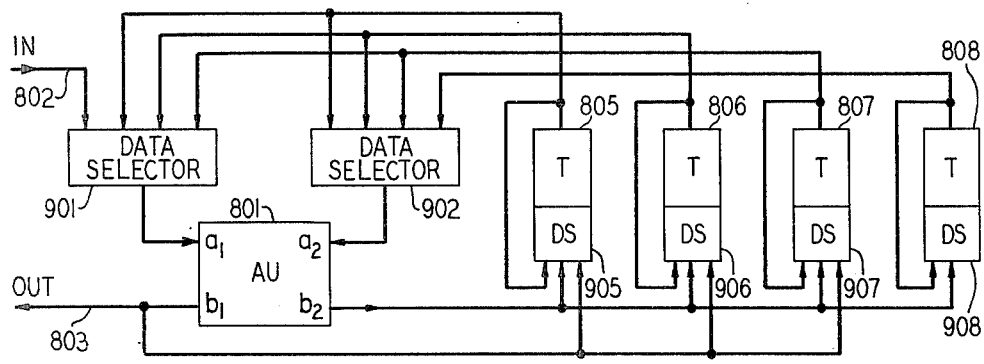
FIG. 9 shows the main circuitry of a $4^{th}$ order multiplexed one-port network.
FIG. 10 is a table showing the data stored in the storage elements of FIG. 9.

FIG. 9 is a block diagram of the principal components in the aforedescribed multiplexed fourth order one-port network. Similar numerical designations are given to those components in FIG. 9 which correspond to components in FIG. 8. A data selector network 901 interconnects the output of storage elements 805, 806 and 807 and input lead 802 with the $a_1$ input of arithmetic unit 801 and a data selector network 902 interconnects the outputs of storage elements 805, 806, 807 and 808 with the $a_2$ input of arithmetic unit 801. In the manner described hereinabove in connection with FIGS. 8A–8D, the appropriate digital signal is applied to the $a_1$ and $a_2$ inputs of arithmetic unit 801 during each time slot within each sampling interval. Data selector networks 905, 906, 907 and 908 at the inputs, respectively, of storage elements 805, 806, 807 and 808 select the appropriate input data to the associated storage element in accordance with the sequencing discussed in connection with FIGS. 8A–8D. During those time slots during which neither the $b_1$ or $b_2$ outputs of arithmetic unit 801 are to be stored in a storage element, the previously stored signal is recirculated. Thus, during each time slot the signal in each storage element is replaced by either the signal from the $b_1$ or $b_2$ output of arithmetic unit 801 or its own previously stored signal. Data selector networks 905 through 908 select the appropriate input to the associated storage element.

Data selector networks 901, 902 and 905 through 908 are networks well known in the art which select one of a plurality of input signals as an output signal in response to a control signal. Although the control circuitry for data selectors 901, 902 and 905 through 908 is not shown in FIG. 9, an eighth order digital wave filter incorporating two multiplexed fourth order one-port networks is described in detail hereinbelow using common control circuitry for each multiplexed fourth order one-port network.

With reference to FIG. 10, a table is illustrated showing the signals in each storage location during each time slot during the sampling interval. The arrows represent data recirculation.

Figure 11:
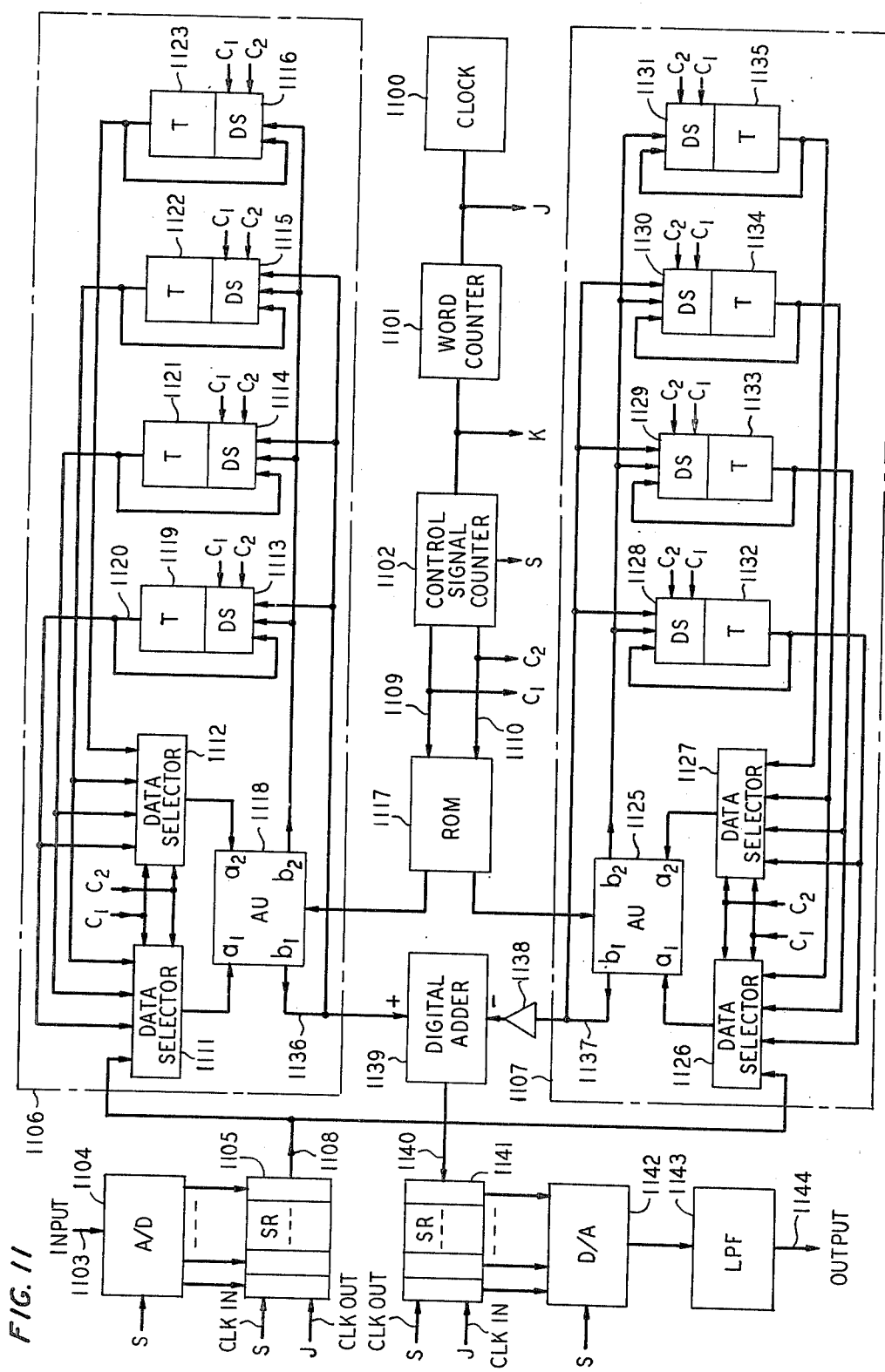
FIG. 11 is a schematic of an $8^{th}$ order wave digital filter which includes two $4^{th}$ order multiplexed one-port networks in accordance with the present invention.

With reference to the eighth order wave digital filter in FIG. 11, a clock circuit 1100 delivers clock pulses J at a rate equal to the sampling rate of the input signal times the number of bits per sample word (N) times the number of time slots into which each sampling period is divided (four, in the described embodiment). Word counter 1101 counts J clock pulses and delivers a K pulse every $N^{th}$ J clock pulse. A control signal counter 1102 counts the K clock pulses and delivers sample pulses S at the sampling rate. As will be described in detail hereinafter, control signal counter 1102 also develops a two-bit binary code word $C_1C_2$ which is used to control the data selector networks of the filter. In response to each sample clock pulse S, the input analog signal on lead 1103 is sampled by analog-to-digital converter 1104 and converted into a digital word in parallel format and clocked into shift register 1105. The bits in register 1105 are then serially clocked out onto lead 1108 in response to the clock pulses J. This serial output sample is inputted to fourth order one-port network 1106 and fourth order one-port network 1107.

During time slot 1, which follows a clock pulse S, control signal counter 1102 develops ON or OFF signals on leads 1109 and 1110 to form a binary code word $C_1C_2$ to control data selectors 1111 through 1116 in network 1106. In response to this same binary code, a read-only memory 1117 adjusts the multiplier coefficient within arithmetic unit 1118 to the $AU_1$ configuration. In response to the binary code $C_1C_2$ during this time slot 1, data selector 1111 interconnects lead 1108 to the $a_1$ input of arithmetic unit 1118. Similarly, data selector 1112 interconnects the output lead 1120 of storage element 1119 to the $a_2$ input of arithmetic unit 1118. Data selector 1113 interconnects the $b_2$ output of arithmetic unit 1118 to storage location 1119. Similarly, in response to the same binary code, data selectors 1114 through 1116 interconnects the outputs of storage locations 1121 through 1123, respectively, back to their inputs. During time slot 1, the $b_1$ output of arithmetic unit 1118 is the output of one-port network 1106 and is combined with the output of one-port network 1107 as will be described in detail hereinafter.

In response to the next K pulse, a new binary code word $C_1C_2$ is developed by control signal counter 1102. In response to the new binary code word, read-only memory 1117 readjusts the multiplier coefficient of arithmetic unit 1118 to configure the same as $AU_2$. During time slot 2, data selector 1111 interconnects the output of storage element 1119 to the $a_1$ input of arithmetic unit 1118 and data selector 1112 interconnects the output of storage element 1121 to the $a_2$ input. The $b_1$ output of arithmetic unit 1118 is inputted to storage element 1119 by data selector 1113 and the $b_2$ output of arithmetic unit 1118 is inputted to storage element 1121 by data selector 1114. Data selectors 1115 and 1116 recirculate the data stored in storage elements 1122 and 1123, respectively. In response to the third K pulse, control signal counter 1102 generates a new binary code word $C_1C_2$. In response to the new code word, data selectors 1111 through 1116 interconnect the appropriate storage elements to the $a_1$ and $a_2$ inputs of arithmetic unit 1118 and the $b_1$ and $b_2$ outputs to the appropriate storage elements as can be determined by reference to FIG. 8 and the time slot 3 column in FIG. 10. In response to the same K clock pulse, the multiplier coefficient of arithmetic unit 1118 is adjusted to its $AU_3$ configuration by read-only memory 1117. In response to the next K pulse from clock 1101, control signal counter 1102 generates a new binary code word $C_1C_2$ to control data selectors 1111 through 1116 and read-only memory 1117.

During each sampling interval, one-port network 1107 functions in parallel with one-port network 1106. Thus, arithmetic unit 1125 is also sequentially configured by read-only memory 1117 in response to the $C_1C_2$ binary code word at the output of control signal counter 1102. In response to each K pulse the $C_1C_2$ binary code word controls data selectors 1126–1131 so that the proper signals are inputted to the $a_1$ and $a_2$ inputs of arithmetic unit 1125 and the $b_1$ and $b_2$ outputs of arithmetic unit 1125 are outputted to the proper storage elements.

As noted hereinabove, the $b_1$ output of arithmetic unit 1118 during time slot 1 is the output of one-port network 1106. Similarly, the $b_1$ output of arithmetic unit 1125 during time slot 1 is the output of one-port network 1107. Lead 1136 interconnects the $b_1$ output of arithmetic unit 1118 and digital adder 1139. Lead 1137 interconnects the $b_1$ output of arithmetic unit 1125 and a digital inverter 1138 (i.e., multiplies by coefficient of $-1$), the output of the latter being connected to digital adder 1139. Digital adder 1139 thus combines the output of one-port network 1106 with the negative output of one-port network 1107 to form on lead 1140 a digital word representing a digital sample of the filtered input signal. The output of digital adder 1139 is inputted into a shift register 1141 in response to the J clock pulses from clock 1101 and the resultant digital word stored therein is clocked out in parallel format into a digital-to-analog converter 1142 in response to an S clock pulse. The analog signal formed by digital-to-analog converter 1142 is filtered by a low-pass filter 1143 to produce the desired output analog filtered signal on output lead 1144.

Figure 12:
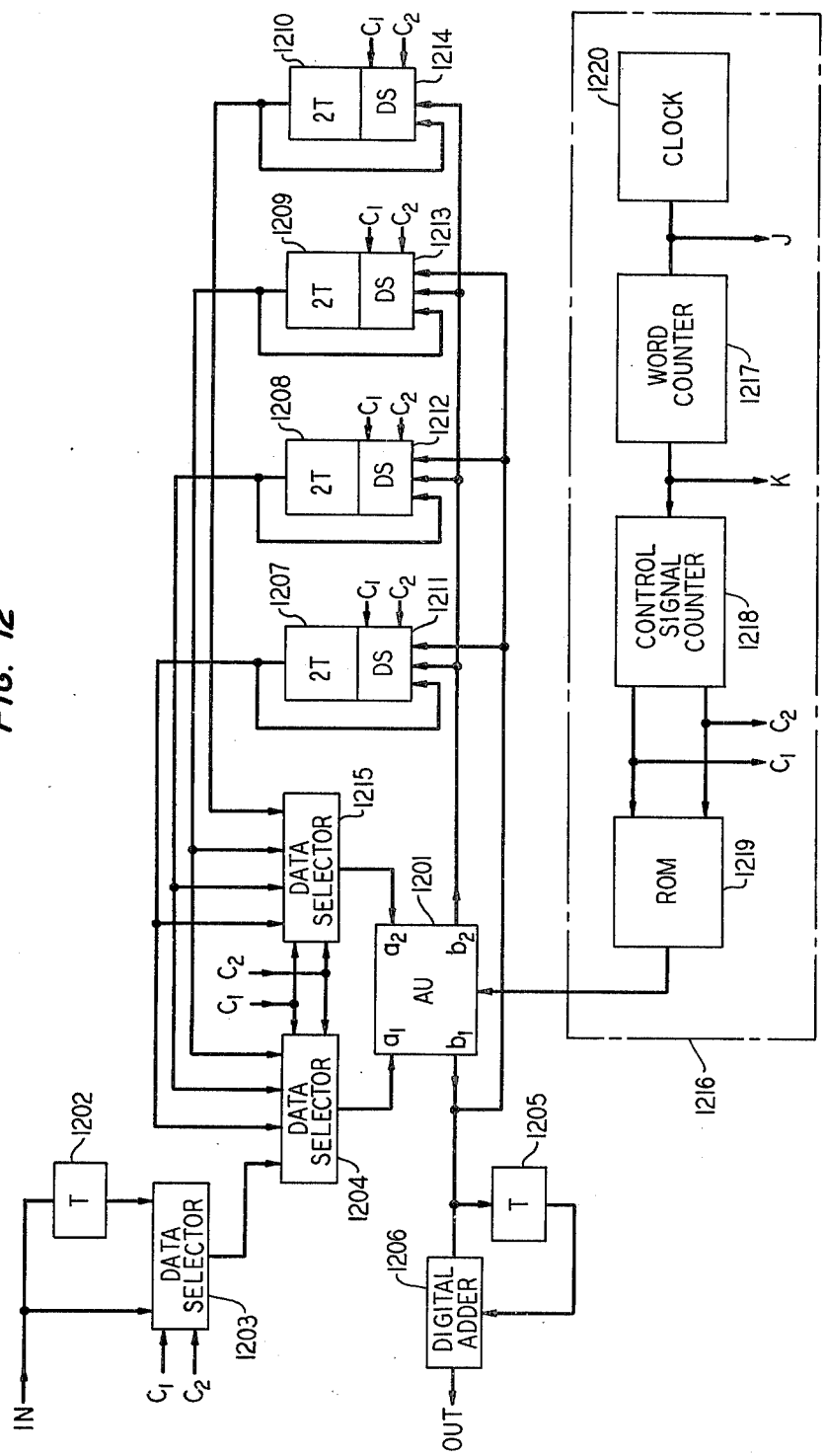
FIG. 12 is an $8^{th}$ order multiplexed wave digital filter in which the two one-port networks are multiplexed together.

The eighth order wave digital filter in FIG. 11 and hereinabove discussed can be further multiplexed to employ only one arithmetic unit. FIG. 12 illustrates a simplified eighth order multiplexed wave digital filter in which the signals at the IN and OUT leads are in digital format. In this embodiment, each sampling interval is divided into eight time slots. Therefore, this filter will function internally at twice the speed of the multiplexed filter of FIG. 11. With reference to FIG. 12, an eighth order multiplexed wave digital filter employing one arithmetic unit will be briefly described. In this embodiment of the present invention, arithmetic unit 1201 is alternately configured as an arithmetic unit from each one-port network which comprises the filter. Thus, the arithmetic unit is configured in the following order: $AU_{1A}$, $AU_{1B}$, $AU_{2A}$, $AU_{2B}$, $AU_{3A}$, $AU_{3B}$, $AU_{4A}$ and $AU_{4B}$, where the A and B subscripts indicate the two one-port networks A and B which comprise the digital filter. Since, however, the input signal is needed as the $a_1$ input of arithmetic unit 1201 for both the $AU_{1A}$ and $AU_{1B}$ configurations, storage elements 1202 stores the input signal for one time slot. Accordingly, during time slot 1 when arithmetic unit 1201 is configured as $AU_{1A}$, the input signal is applied to the $a_1$ input of arithmetic unit 1201 through data selector 1203 and data selector 1204. During time slot 2 when arithmetic unit 1201 is configured as the $AU_{1B}$, the input signal stored in storage element 1202 is interconnected through data selector 1203 and data selector 1204 to the $a_1$ input. Similarly, during time slot 1, the $b_1$ output of $AU_{1A}$ is stored by storage element 1205 to be added by digital adder 1206 to the $b_1$ output of $AU_{1B}$ to form the desired digital filtered output signal. As an alternative to employing eight storage elements, four storage elements 1207 through 1210, each having double storage capacity, are employed in this embodiment. Each storage element thus stores in a "piggy-back" manner two output signals from arithmetic unit 1201. Data selectors 1211 through 1214 control the signal input to each storage element in the same manner described in connection with the corresponding data selectors in FIG. 11. The signals stored in storage elements 1207 through 1210 are selectively inputted to the $a_1$ input of arithmetic unit 1201 through data selector 1204, and to the $a_2$ input through data selector network 1215. Control circuitry 1216 which includes a clock 1220, a word counter 1217, a control signal counter 1218 and a read-only memory 1219 functions in a manner similar to the corresponding circuitry in FIG. 11. Since, however, each sampling interval is divided into eight time slots, clock 1217 generates clock pulses K at twice the rate of the K pulses generated by clock 1101 in FIG. 11. The $b_1$ and $b_2$ output signals from arithmetic unit 1201 to storage elements 1207 through 1210 follow a pattern similar to this described in connection with the discussion of FIG. 11 and thus do not warrant repetition here and now.

The above-described arrangements are illustrative of the application and principles of the invention. Other embodiments may be devised by those skilled in the art without departing from the spirit and scope of the invention.

I claim:

1. A wave digital filter having minimum arithmetic digital hardware derived from a symmetric lattice reference filter for filtering input digital samples of a signal comprising:

an arithmetic unit having first and second inputs and first and second outputs, said arithmetic unit including first combining means for digitally combining the signals at said first and second inputs. multiplying means for digitally multiplying by a multiplicand the combined signals from said first and second inputs, second combining means for digitally combining the multiplied combined signals with the signal at said first input to generate a digital signal at said second output, and third combining means for digitally combining the multiplied combined signals with the digital signal at said second input to produce a digital signal at said first output, said multiplying means being adaptively controlled to vary at predetermined instants its multiplicand in a predetermined cyclical manner, at each of said instants said first, second and third combining means and said multiplying means forming arithmetic combinations of the digital signals present at said first and second inputs at that instant to form the digital signals at said first and second outputs, a plurality of storage means for storing signals from the outputs of said arithmetic unit;

first selection means for selectively inputting to said inputs of said arithmetic unit in a predetermined cyclical manner at said predetermined instants said input digital samples and the signals stored in said plurality of storage means;

second selection means for selectively inputting to said plurality of storage means in a predetermined cyclical manner at said predetermined instants the signals at said outputs of said arithmetic unit; and means combining selected outputs of said arithmetic unit to generate digital samples of the filtered input signal.

2. A wave digital filter in accordance with claim 1 further comprising:

clocking means for generating clock pulses at said predetermined instants; and control means responsive to said clock pulses for generating signals to control said first and second selection means and said multiplying means.

3. A wave digital filter in accordance with claim 2 wherein said plurality of storage means are shift registers.

4. An $M+N^{th}$ order wave digital filter derived from a symmetric lattice reference filter for filtering input digital samples of a signal comprising:

an $N^{th}$ order one-port digital network for digitally processing said input digital samples comprising:

a first arithmetic unit having first and second inputs and first and second outputs, said first arithmetic unit including first combining means for digitally combining the signals at said first and second inputs, multiplying means for digitally multiplying by a multiplicand the combined signals from said first and second inputs, second combining means for digitally combining the multiplied combined signals with the signal on said first input to generate a digital signal at said second output, and third combining means for digitally combining the multiplied combined signals with the digital signal at said second input to produce a digital signal at said first output, said multiplying means being adaptively controlled to vary at predetermined instants its multiplicand in a predetermined cyclical manner, at each of said instants said first, second and third combining means and said multiplying means forming arithmetic combinations of the digital signals present at said first and second inputs at that instant to form the digital signals at said first and second outputs, N storage means for storing signals from the outputs of said first arithmetic unit;

first selection means for selectively inputting to said inputs of said first arithmetic unit in a predetermined cyclical manner at said predetermined instants said input digital samples and the signals stored in said N storage means; and second selection means for selectively inputting to said N storage means in a predetermined cyclical manner at said predetermined instants the signals at said outputs of said first arithmetic unit; and an $M^{th}$ order one-port digital network for digitally processing said input digital samples comprising:

a second arithmetic unit having first and second inputs and first and second outputs, said second arithmetic unit including first combining means for digitally combining the signals at said first and second inputs, multiplying means for digitally multiplying by a multiplicand the combined signals from said first and second inputs, second combining means for digitally combining the multiplied combined signals with the signal on said first input to generate a digital signal at said second output, and third combining means for digitally combining the multiplied combined signals with the digital signal at said second input to produce a digital signal at said first output, said multiplying means being adaptively controlled to vary at predetermined instants its multiplicand in a predetermined cyclical manner, at each of said instants said first, second and third combining means and said multiplying means forming arithmetic combinations of the digital signals present at said first and second inputs at that instant to form the digital signals at said first and second outputs;

M storage means for storing signals from the outputs of said second arithmetic unit;

third selection means for selectively inputting to said inputs of said second arithmetic unit in a predetermined cyclical manner at said predetermined instants said input digital samples and the signals stored in said M storage means; and fourth selection means said M storage means for selectively inputting to said M storage means in a predetermined cyclical manner at said predetermined instants the signals at said outputs of said second arithmetic unit; and means for combining the digitally processed outputs of said $M^{th}$ and $N^{th}$ order networks.

5. A wave digital filter in accordance with claim 4 further comprising:

clock means for generating clock pulses at said predetermined instants; and control means responsive to said clock pulses for generating signals to control said first, second, third and fourth selection means and said multiplying means in said first and second arithmetic units.

6. A wave digital filter in accordance with claim 5 wherein said N storage means and said M storage means are shift registers.

7. A one-port digital network for processing an input digital signal comprising:

an input terminal for receiving said input digital signal;

an output terminal for receiving the processed input digital signal;

an arithmetic unit having first and second inputs and first and second outputs, said arithmetic unit including first combining means for digitally combining the signals at said first and second inputs, multiplying means for digitally multiplying by a multiplicand the combined signals from said first and second inputs, second combining means for digitally combining the multiplied combined signals with the signal at said first input to generate a digital signal at said second output, and third combining means for digitally combining the multiplied combined signals with the digital signal at said second input to produce a digital signal at said first output, said multiplying means being adaptively controlled to vary at predetermined instants its multiplicand in a predetermined cyclical manner, at each of said instants said first, second and third combining means and said multiplying means forming arithmetic combinations of the digital signals present at said first and second inputs at that instant to form the digital signals at said first and second outputs, means connecting said second output of said arithmetic unit to said output terminal;

a plurality of storage means for storing signals from the first and second outputs of said arithmetic unit;

first selection means for selectively inputting to said inputs of said arithmetic unit in a predetermined cyclical manner at said predetermined instants said input digital signal and the signals stored in said storage means; and second selection means for selectively inputting to said storage means in a predetermined cyclical manner at said predetermined instants the signals at said first and second outputs of said arithmetic unit.

8. A one-port digital network in accordance with claim 7 further comprising:

clocking means for generating clock pulses at said predetermined instants; and control means responsive to said clock pulses for generating signals to control said first and second selection means and said multiplying means.

9. A one-port digital network in accordance with claim 8 wherein said plurality of storage means are shift registers.

* * * * *